(12) United States Patent
Hsieh

(10) Patent No.: US 12,262,564 B2
(45) Date of Patent: Mar. 25, 2025

(54) IMAGE SENSOR

(71) Applicant: UNITED MICROELECTRONICS CORP., Hsin-Chu (TW)

(72) Inventor: Cheng-Yu Hsieh, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/676,451

(22) Filed: May 28, 2024

(65) Prior Publication Data

US 2024/0313020 A1 Sep. 19, 2024

Related U.S. Application Data

(63) Continuation of application No. 17/333,040, filed on May 28, 2021, now Pat. No. 12,027,555.

(30) Foreign Application Priority Data

May 10, 2021 (CN) .......................... 202110504117.3

(51) Int. Cl.
*H10F 39/00* (2025.01)
*H10F 39/18* (2025.01)

(52) U.S. Cl.
CPC ......... *H10F 39/807* (2025.01); *H10F 39/182* (2025.01); *H10F 39/184* (2025.01); *H10F 39/8033* (2025.01); *H10F 39/8053* (2025.01); *H10F 39/8067* (2025.01); *H10F 39/811* (2025.01)

(58) Field of Classification Search
None
See application file for complete search history.

(56) References Cited

U.S. PATENT DOCUMENTS

| 5,373,182 A | 12/1994 | Norton |
| 5,453,611 A | 9/1995 | Oozu |
| 6,198,147 B1 | 3/2001 | Connolly |
| 7,157,300 B2 | 1/2007 | Lee |

(Continued)

FOREIGN PATENT DOCUMENTS

| CN | 109768057 A | * | 5/2019 | ......... H01L 27/1461 |
| CN | 111009540 A | * | 4/2020 | ....... H01L 27/14605 |

(Continued)

*Primary Examiner* — Scott B Geyer
(74) *Attorney, Agent, or Firm* — Winston Hsu

(57) ABSTRACT

An image sensor includes a semiconductor substrate, a first isolation structure, a visible light detection structure, and an infrared light detection structure. The semiconductor substrate has a first surface and a second surface opposite to the first surface in a vertical direction. The first isolation structure is disposed in the semiconductor substrate for defining pixel regions in the semiconductor substrate. The visible light detection structure and the infrared light detection structure are disposed within the same pixel region, and a first portion of the visible light detection structure is disposed between the second surface of the semiconductor substrate and the infrared light detection structure in the vertical direction. The infrared light detection structure includes an epitaxial structure disposed in the semiconductor substrate, and the visible light detection structure includes a doped region including a material identical to a material of the semiconductor substrate.

19 Claims, 9 Drawing Sheets

(56) References Cited

U.S. PATENT DOCUMENTS

| | | |
|---|---|---|
| 7,453,129 B2 | 11/2008 | King |
| 9,040,916 B2 | 5/2015 | Cazaux |
| 9,679,933 B2 | 6/2017 | Huang |
| 10,056,423 B1 | 8/2018 | Huang |
| 10,136,076 B2 | 11/2018 | Tanaka |
| 10,224,359 B2 | 3/2019 | Pralle |
| 10,424,568 B1 | 9/2019 | Tan |
| 10,854,647 B2 | 12/2020 | Huang |
| 11,398,522 B2 | 7/2022 | Yamakawa |
| 2003/0169359 A1 | 9/2003 | Merrill |
| 2008/0315104 A1* | 12/2008 | Nam ................. H01L 27/14603 250/370.08 |
| 2009/0200589 A1 | 8/2009 | Qian |
| 2010/0102206 A1* | 4/2010 | Cazaux .............. H10F 39/1825 257/432 |
| 2012/0001241 A1* | 1/2012 | Park .................. H10F 39/8033 257/292 |
| 2012/0256090 A1* | 10/2012 | Sa ......................... G01J 3/513 250/349 |
| 2013/0062522 A1 | 3/2013 | Jiang |
| 2013/0176396 A1 | 7/2013 | Cohen |
| 2013/0234029 A1 | 9/2013 | Bikumandla |
| 2014/0077323 A1* | 3/2014 | Velichko ............ H01L 27/1464 257/432 |
| 2015/0287766 A1 | 10/2015 | Kim |
| 2015/0295007 A1 | 10/2015 | Cellek |
| 2015/0304638 A1 | 10/2015 | Cho |
| 2016/0027837 A1 | 1/2016 | Webster |
| 2016/0197116 A1 | 7/2016 | Ikeda |
| 2016/0358969 A1 | 12/2016 | Fu |
| 2017/0062508 A1 | 3/2017 | Na |
| 2018/0013961 A1 | 1/2018 | Lee |
| 2018/0069046 A1 | 3/2018 | Jin |
| 2018/0190708 A1 | 7/2018 | Lee |
| 2018/0233521 A1 | 8/2018 | Na |
| 2018/0294305 A1 | 10/2018 | Janssens |
| 2018/0359434 A1 | 12/2018 | Tanaka |
| 2019/0088697 A1 | 3/2019 | Furukawa |
| 2019/0132506 A1 | 5/2019 | Cheng |
| 2019/0172868 A1 | 6/2019 | Chen |
| 2019/0288026 A1* | 9/2019 | Von Kaenel .......... H10F 39/021 |
| 2019/0319062 A1 | 10/2019 | Lee |
| 2019/0348460 A1 | 11/2019 | Chen |
| 2019/0378872 A1 | 12/2019 | Chen |
| 2020/0227582 A1 | 7/2020 | Yamashita |
| 2021/0058574 A1 | 2/2021 | Duan |
| 2021/0098524 A1 | 4/2021 | Liu |
| 2021/0183922 A1 | 6/2021 | Chou |
| 2021/0335880 A1 | 10/2021 | Yamakawa |
| 2022/0320173 A1 | 10/2022 | Chou |
| 2022/0399469 A1* | 12/2022 | Minari ............. H01L 27/14683 |

FOREIGN PATENT DOCUMENTS

| | | |
|---|---|---|
| EP | 3 389 092 A1 | 10/2018 |
| JP | 6147276 B2 | 6/2017 |
| KR | 102070778 B1 | 3/2020 |
| WO | 2014/080625 A1 | 5/2014 |

* cited by examiner

IMAGE SENSOR

CROSS REFERENCE TO RELATED APPLICATIONS

This application is a continuation application of U.S. application Ser. No. 17/333,040, filed on May 28, 2021. The content of the application is incorporated herein by reference.

BACKGROUND OF THE INVENTION

1. Field of the Invention

The present invention relates to an image sensor, and more particularly, to an image sensor including a visible light detection structure and an infrared light detection structure.

2. Description of the Prior Art

With the development of computer and communications industries, demand for high-efficiency image sensor has been increased. Such image sensors are used in various fields, such as digital cameras, camcorders, personal communications systems, game components, monitors, medical micro camera, robots, etc.

In image sensors, in addition to the visible light detection element that receives visible light and converts it into the corresponding image signal, light detection elements for other wavelength ranges may also be disposed for providing image capture and other additional functions. For example, it can be used to sense distance and/or depth for 3D images, augmented reality (AR) and other related applications. Therefore, how to improve light sensitivity and quantum efficiency (QE) of the light detection units corresponding to visible light and other wavelength ranges in the image sensor through the design of structures, materials, and/or processes is a continuous issue for those in the related fields.

SUMMARY OF THE INVENTION

An image sensor is provided in the present invention. A visible light detection structure and an infrared light detection structure are disposed within the same pixel region for improving light sensitivity, quantum efficiency, and other related properties of the image sensor.

According to an embodiment of the present invention, an image sensor is provided. The image sensor includes a semiconductor substrate, a first isolation structure, at least one visible light detection structure, and at least one infrared light detection structure. The semiconductor substrate has a first surface and a second surface opposite to the first surface in a vertical direction. The first isolation structure is disposed in the semiconductor substrate for defining pixel regions in the semiconductor substrate. The visible light detection structure and the infrared light detection structure are disposed in the semiconductor substrate, and the visible light detection structure and the infrared light detection structure are disposed within one of the pixel regions. A first portion of the visible light detection structure is disposed between the infrared light detection structure and the second surface of the semiconductor substrate in the vertical direction. The infrared light detection structure includes an epitaxial structure disposed in the semiconductor substrate, and the visible light detection structure includes a doped region including a material identical to a material of the semiconductor substrate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 4-9 are schematic drawings illustrating a manufacturing method of an image sensor according to an embodiment of the present invention, wherein FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, and FIG. 9 is a schematic drawing in a step subsequent to FIG. 8.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
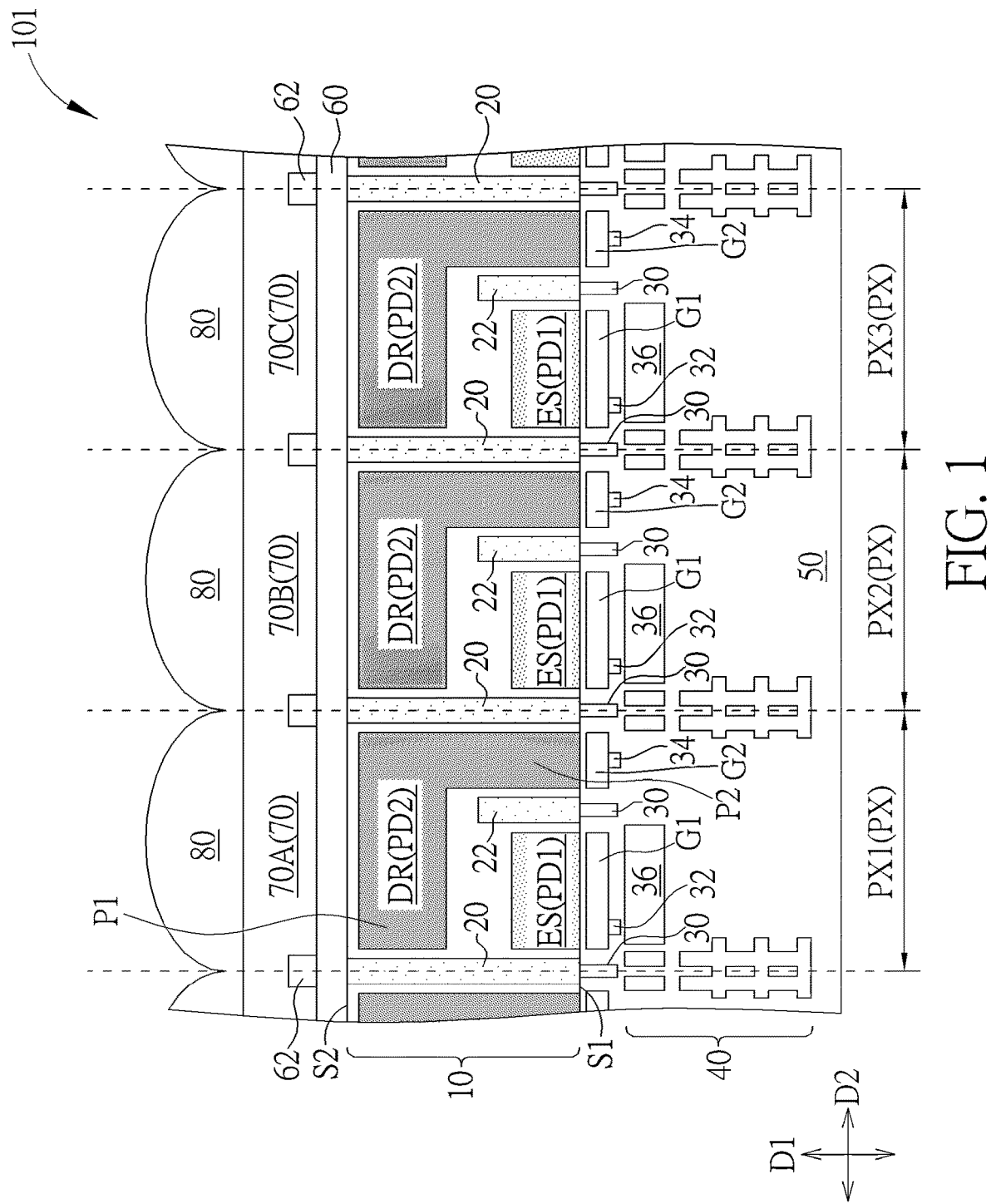
FIG. 1 is a schematic drawing illustrating an image sensor according to a first embodiment of the present invention.

Please refer to FIG. 1. FIG. 1 is a schematic drawing illustrating an image sensor 101 according to a first embodiment of the present invention. As shown in FIG. 1, the image sensor 101 includes a semiconductor substrate 10, a first isolation structure 20, at least one infrared light detection structure PD1, and at least one visible light detection structure PD2. The semiconductor substrate 10 has a first surface S1 and a second surface S2 opposite to the first surface S1 in a vertical direction (such as a first direction D1 shown in FIG. 1). The first isolation structure 20 is disposed in the semiconductor substrate 10 for defining pixel regions PX in the semiconductor substrate 10. The visible light detection structure PD2 and the infrared light detection structure PD1 are disposed in the semiconductor substrate 10, and the visible light detection structure PD2 and the infrared light detection structure PD1 are disposed within one of the pixel regions PX. A first portion P1 of the visible light detection structure PD2 is disposed between the infrared light detection structure PD1 and the second surface S2 of the semiconductor substrate 10 in the first direction D1.

In other words, the infrared light detection structure PD1 and the visible light detection structure PD2 may be disposed in the same semiconductor substrate 10 and located within the same pixel region PX, and a part of the visible light detection structure PD2 may overlap the infrared light detection structure PD1 in the first direction D1 for enhancing the light sensitivity or the quantum efficiency (QE) of the infrared light detection structure PD1 while the dimension of each of the pixel regions PZ is limited (such as a condition where the dimension of each pixel region PX has to be reduced relatively for increasing the total resolution of the image sensor 101).

In some embodiments, the first direction D1 described above may be regarded as a thickness direction of the semiconductor substrate 10. The second surface S2 may be regarded as a light-incident surface or a side facing a light source, and the first surface may be regarded as a side facing away from the light source. A horizontal direction orthogonal to the first direction D1 (such as a second direction D2 shown in FIG. 1) may be substantially parallel with the first surface S1 of the semiconductor substrate 10 and/or the second surface S2 of the semiconductor substrate 10, but not limited thereto. In the image sensor 101, each of the pixel regions PX may be surrounded by the first isolation structure 20 in a horizontal direction (such as the second direction D2 described above and other directions orthogonal to the first direction D1). In some embodiments, the image sensor 101 may include a plurality of the infrared light detection structures PD1 and a plurality of the visible light detection structures PD2, and at least one of the pixel regions PX may have the infrared light detection structure PD1 and the visible light detection structure PD2 disposed therein. For example, in some embodiments, one infrared light detection structure PD1 and one visible light detection structure PD2 may be disposed in each pixel region PX, and at least some of the pixel regions PX may be used to detecting different colors of visible light, respectively, but not limited thereto.

In some embodiments, the visible light detection structure PD2 may include a visible light photodiode or a portion of a visible light photodiode, and the infrared light detection structure PD1 may include an infrared photodiode or a portion of an infrared photodiode, but not limited thereto. In some embodiments, the infrared light detection structure PD1 may include other structures (apart from photodiodes) capable of converting infrared light into corresponding electrical signals, and the visible light detection structure PD2 may include other structures (apart from photodiodes) capable of converting visible light into corresponding electrical signals. In addition, in some embodiments, a material composition of the infrared light detection structure PD1 may be different from a material composition of the visible light detection structure PD2 for enhancing the light sensitivity and/or the QE of the infrared light detection structure PD1.

For example, the infrared light detection structure PD1 may include an epitaxial structure ES disposed in the semiconductor substrate 10, and the visible light detection structure PD2 may include a doped region DR disposed in the semiconductor substrate 10, but not limited thereto. In some embodiments, the semiconductor substrate 10 may include a silicon substrate, a silicon-containing substrate, or a substrate made of other suitable semiconductor materials, and the doped region DR may be formed by performing a doping process (such as an ion implantation process or other suitable doping approaches) to the semiconductor substrate 10, and the doped region DR may include a part of the semiconductor substrate 10 (such as silicon) and a dopant implanted into the semiconductor substrate 10 by the doping process described above. In other words, the doped region DR may include a material (such as silicon) identical to a material of the semiconductor substrate 10, and the material may be different from the material of the epitaxial structure ES. Additionally, in some embodiments, the epitaxial structure ES may include epitaxial germanium, III-V compound semiconductor epitaxial material (such as epitaxial indium gallium arsenide, InGaAs), or a material having an infrared light absorption (or absorption rate) higher than that of the material of the semiconductor substrate 10. Accordingly, even though the infrared light detection structure PD1 and the visible light detection structure PD2 are disposed in the same semiconductor substrate 10 and located within the same pixel region PX, and the first portion P1 of the visible light detection structure PD2 overlaps the infrared light detection structure PD1 in the first direction D1 and is located between the light-incident surface (such as the second surface S2) and the infrared light detection structure PD1 in the first direction D1, the infrared light detection structure PD1 in the image sensor 101 may still have a great photoelectric conversion performance by forming the infrared light detection structure PD1 with the epitaxial material having a relatively higher infrared light absorption rate for improving the light sensitivity and/or the QE of the infrared light detection structure PD1.

In some embodiments, the image sensor 101 may further include a second isolation structure 22 disposed in the semiconductor substrate 10 and located in the pixel regions PX, but not limited thereto. In some embodiments, a second portion P2 of the visible light detection structure PD2 may disposed between the first isolation structure 20 and the infrared light detection structure PD1 located in the same pixel region PX in a horizontal direction (such as the second direction D2), the second portion P2 of the visible light detection structure PD2 may be elongated towards the first surface S1 in the first direction D1, and the second portion P2 of the visible light detection structure PD2 may be directly connected with the first portion P1 of the visible light detection structure PD2, but not limited thereto. In addition, in at least one of the pixel regions PX, a part of the second isolation structure 22 may be disposed between the infrared light detection structure PD1 and the second portion P2 of the visible light detection structure PD2 in the second direction D2 for reducing the interference between the infrared light detection structure PD1 and the visible light detection structure PD2 in the same pixel region PX. In some embodiments, the first isolation structure 20 and the second isolation structure 22 may respectively include a single layer or multiple layers of insulation materials, such as silicon oxide, silicon nitride, or other suitable insulation materials.

In some embodiments, a part of the first isolation structure 20 may penetrate through the semiconductor substrate 10 in the first direction D1, and the first portion P1 of the visible light detection structure PD2 may be disposed between the second surface S2 of the semiconductor substrate 10 and the second isolation structure 22 in the first direction D1, but not limited thereto. In some embodiments, a length of the second isolation structure 22 in the first direction D1 may be greater than or equal to a length of the infrared light detection structure PD1 in the first direction D1, and the length of the second isolation structure 22 in the first direction D1 may be less than a length of the first isolation structure 20 in the first direction D1 for reducing the interference between the infrared light detection structure PD1 and the visible light detection structure PD2 located in the same pixel region PX in the second direction D2 by the second isolation structure 22 and avoiding the negative influence of a second isolation structure 22 extending to the visible light detection structure PD2 on the visible light detection structure PD2.

In some embodiments, the image sensor 101 may further include at least one first gate electrode G1, at least one second gate electrode G2, a reflective structure 30, at least one contact structure 32, at least one contact structure 34, at least one reflective layer 36, an interconnection structure 40, and a dielectric layer 50, but not limited thereto. The first gate electrode G1, the second gate electrode G2, the reflective structure 30, the contact structure 32, the contact structure 34, the reflective layer 36, the interconnection structure 40, and the dielectric layer 50 may disposed on the first surface S1 of the semiconductor substrate 10. In some embodiments, the first gate electrode G1 may be disposed corresponding to the infrared light detection structure PD1, the second gate electrode G2 may be disposed corresponding to the visible light detection structure PD2, the first gate electrode G1 may be a gate electrode of a transistor (not shown in FIG. 1) electrically connected with the infrared light detection structure PD1, and the second gate electrode G2 may be a gate electrode of a transistor (not shown in FIG. 1) electrically connected with the visible light detection structure PD2, but not limited thereto.

In some embodiments, the reflective structure 30 may be an electrically floating conductive structure. In other words, the reflective structure 30 may be not electrically connected with other parts. A part of the reflective structure 30 may be disposed on the first isolation structure 20 in the first direction D1, and another part of the reflective structure 30 may be disposed between the first gate electrode G1 and the second gate electrode G2 for reducing the light interference between the pixel regions PX adjacent to each other, the light interference between the infrared light detection structure PD1 and the visible light detection structure PD2 located in the same pixel region PX, and/or increasing the light sensitivity of the infrared light detection structure PD1, but not limited thereto. Additionally, in some embodiments, when the image sensor 101 is viewed in the first direction D1 (such as viewing the image sensor 101 at a side of the second surface S2), the reflective structure 30 disposed between the first gate electrode G1 and the second gate electrode G2 may be disposed on the second isolation structure 22 in the first direction D1, and the reflective structure 30 disposed between the first gate electrode G1 and the second gate electrode G2 may overlap at least a part of the second isolation structure 22 in the first direction D1. Therefore, the reflective structure 30 may be not directly contact the semiconductor substrate 10 for reducing the electrical influence of the reflective structure 30 on the infrared light detection structure PD1 and the visible light detection structure PD2.

In some embodiments, the contact structure 32 may be disposed on and electrically connected with the first gate electrode G1, the contact structure 34 may be disposed on and electrically connected with the second gate electrode G2. The reflective structure 30, the contact structure 32, and the contact structure 34 may be formed concurrently by the same manufacturing process for process simplification, and the material compositions of the reflective structure 30, the contact structure 32, and the contact structure 34 may be identical to one another accordingly, but not limited thereto. In some embodiments, the reflective layer 36 may be disposed corresponding to the infrared light detection structure PD1 in the first direction D1, the infrared light detection structure PD1 may be disposed between the reflective layer 36 and the first portion P1 of the visible light detection structure PD2 in the first direction D1, and the first gate electrode G1 may be located between the infrared light detection structure PD1 and the reflective layer 36 in the first direction D1, but not limited thereto. In addition, the reflective layer 36 and at least a part of the interconnection structure 40 may be formed concurrently by the same manufacturing process for process simplification, and the material composition of the reflective layer 36 may be identical to the material composition of at least a part of the interconnection structure 40 accordingly, but not limited thereto. In some embodiments, the reflective layer 36 may be an electrically floating conductive layer for reducing the negative influence of the reflective layer 36 with relatively larger range on electrical properties of other components (such as the transistor corresponding to the first gate electrode G1 and/or the transistor corresponding to the second gate electrode G2), but not limited thereto.

In some embodiments, the image sensor 101 may include a plurality of the first gate electrodes G1, a plurality of the second gate electrodes G2, and a plurality of the reflective layers 36 disposed corresponding to the pixel regions PX, respectively, but not limited thereto. The first gate electrode G1 and the second gate electrode G2 described above may respectively include non-metallic electrically conductive materials (such as doped polysilicon) or metallic electrically conductive materials, such as a metal gate structure formed with a work function layer and a low resistivity layer stacked with each other, but not limited thereto. The reflective structure 30, the contact structure 32, the contact structure 34, the reflective layer 36, and the interconnection structure 40 described above may respectively include a barrier layer (not shown) and an electrically conductive material (not shown) disposed on the barrier layer, but not limited thereto. The barrier layer described above may include titanium nitride, tantalum nitride, or other suitable barrier materials, and the electrically conductive material described above may include a material with relatively lower electrical resistivity, such as tungsten, aluminum, copper, titanium aluminide, and titanium, but not limited thereto. In addition, the dielectric layer 50 may include high dielectric constant (high-k) dielectric material or other suitable dielectric material (such as silicon oxide).

In some embodiments, the image sensor 101 may further include an anti-reflection layer 60, a patterned isolation structure 62, a plurality of color filter units 70, and a plurality of microlenses 80, but not limited thereto. The anti-reflection layer 60, the patterned isolation structure 62, the color filter units 70, and the microlenses 80 may be disposed on the second surface S2 of the semiconductor substrate 10. The color filter units 70 and the patterned isolation structure 62 may be disposed on the anti-reflection layer 60, and the microlenses 80 may be disposed on the color filter units 70. In some embodiments, the patterned isolation structure 62 may be disposed between the color filter units 70 adjacent to each other for reducing the light interference between the color filter units 70 adjacent to each other, and the patterned isolation structure 62 may include a metal material or a material with a relatively higher optical density (OD).

Each of the color filter units 70 may be disposed corresponding to one of the pixel regions PX in the first direction D1. For example, in some embodiments, the color filter units 70 may include a first color filter unit 70A, a second color filter unit 70B, and a third color filter unit 70C of different colors and disposed adjacent to one another, and the pixel regions PX may include a first pixel region PX1, a second pixel region PX2, and a third pixel region PX3 disposed corresponding to the first color filter unit 70A, the second color filter unit 70B, and the third color filter unit 70C, respectively. Therefore, in some embodiments, the infrared light detection structures PD1 may be disposed in the pixel regions PX corresponding to different colors respectively for increasing the amount of the infrared light detection structures PD1 disposed in the image sensor 101 and/or improving contrast and/or sharpness of the image data generated by the pixel regions PX corresponding to different colors.

Figure 2:
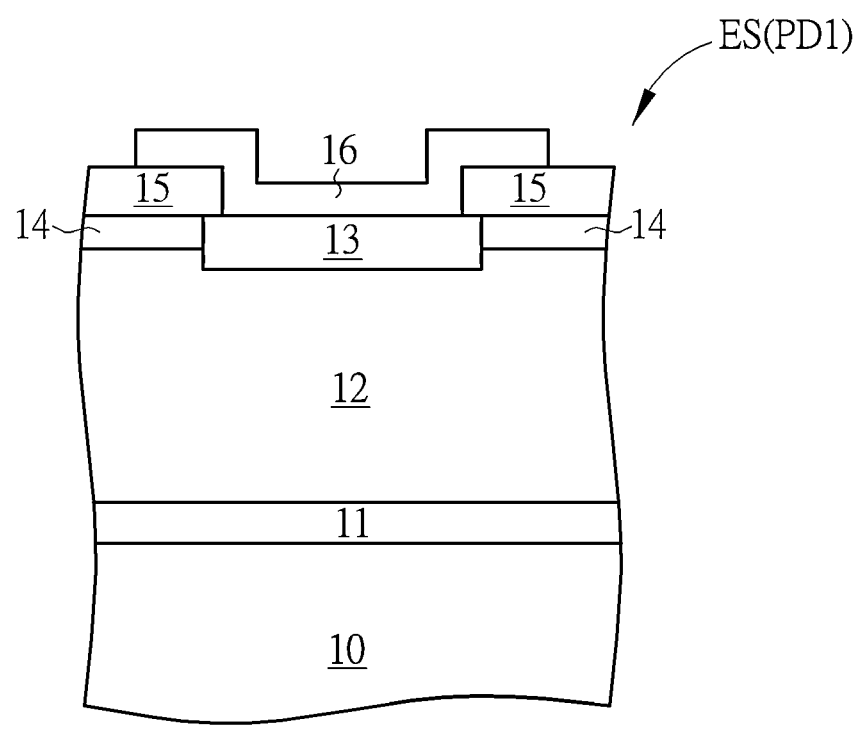
FIG. 2 is a schematic drawing illustrating an infrared light detection structure according to an embodiment of the present invention.

Please refer to FIG. 2 and FIG. 1. FIG. 2 is a schematic drawing illustrating the infrared light detection structure PD1 according to an embodiment of the present invention. As shown in FIG. 2 and FIG. 1, in some embodiments, the infrared light detection structure PD1 may include the epitaxial structure ES formed with a doped epitaxial layer 11, an intrinsic epitaxial layer 12, and a doped epitaxial layer 13. The doped epitaxial layer 11 and the doped epitaxial layer 13 may be a p-type doped epitaxial layer (such as a p-type heavily doped epitaxial germanium layer) and an n-type doped epitaxial layer (such as an n-type heavily doped epitaxial germanium layer), respectively, for forming a PIN photodiode with the intrinsic epitaxial layer 12 (such as an epitaxial germanium layer without being intentionally doped), but not limited thereto. In some embodiments, a doped region 14 (such as a p-type lightly doped epitaxial germanium region) may surround the doped epitaxial layer 13, a patterned insulation layer 15 may be disposed on the doped region 14 and the doped epitaxial layer 13, and a conductive layer 16 may contact and be electrically connected with the doped epitaxial layer 13, but not limited thereto. In some embodiments, the conductive layer 16 may be used to electrically connect the PIN photodiode described above and the transistor corresponding to the first gate electrode G1 described above, and the doped region 14 may be used to reduce the negative influence of the interface defect between the doped epitaxial layer 13 and the patterned insulation layer 15 on the electrical properties of the PIN photodiode, but not limited thereto. It is worth noting that the structure of the infrared light detection structure PD1 in the present invention is not limited to the condition illustrated in FIG. 2 and the infrared light detection structure PD1 with other suitable structural design may be applied according to some design considerations.

Figure 3:
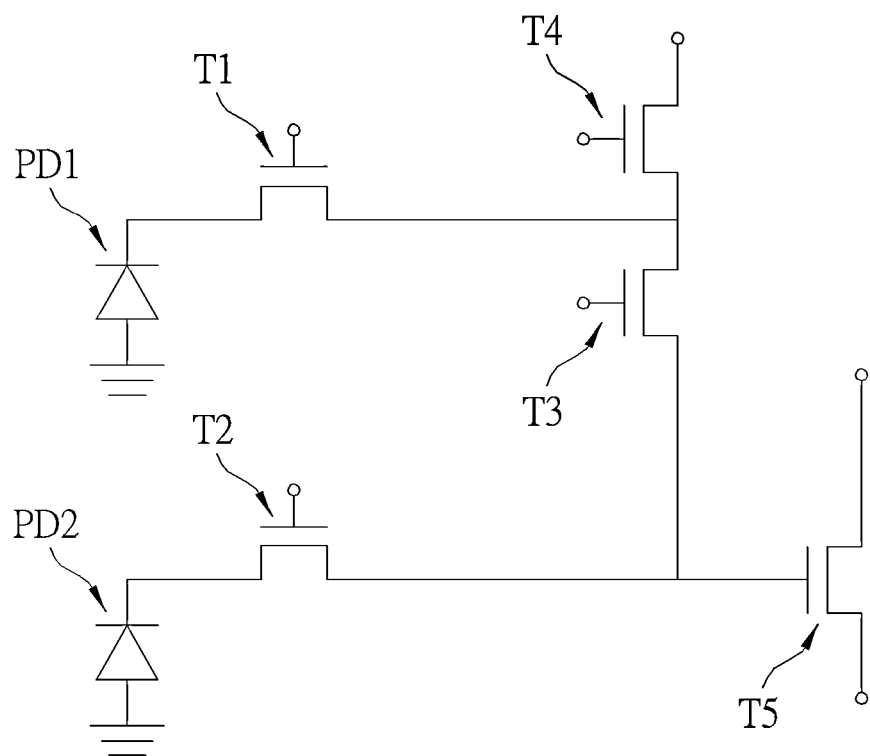
FIG. 3 is a schematic circuit diagram corresponding to a pixel region in an image sensor according to an embodiment of the present invention.

Please refer to FIG. 3 and FIG. 1. FIG. 3 is a schematic circuit diagram corresponding to one pixel region PX in the image sensor according to an embodiment of the present invention. As shown in FIG. 3 and FIG. 1, in some embodiments, a circuit structure corresponding to one pixel region PX may include the infrared light detection structure PD1, the visible light detection structure PD2, a transistor T1, a transistor T2, a transistor T3, a transistor T4, and a transistor T5, but not limited thereto. In some embodiments, a source/drain terminal of the transistor T1 may be electrically connected with the infrared light detection structure PD1, another source/drain terminal of the transistor T1 may be electrically connected with a source/drain terminal of the transistor T3 and a source/drain terminal of the transistor T4, and the first gate electrode G1 described above may be a gate electrode in the transistor T1, but not limited thereto. In addition, a source/drain terminal of the transistor T2 may be electrically connected with the visible light detection structure PD2, another source/drain terminal of the transistor T2 may be electrically connected with another source/drain terminal of the transistor T3 and a gate electrode of the transistor T5, and the second gate electrode G2 described above may be a gate electrode in the transistor T2, but not limited thereto. In some embodiments, the transistor T3 may be regarded as a switch transistor, the transistor T4 may be regarded as a reset transistor because another source/drain terminal of the transistor T4 may be connected with a reset signal source, and the transistor T5 may be regarded as a readout transistor, but not limited thereto. It is worth noting that the circuit structure corresponding to the pixel region PX in the present invention is not limited to the condition illustrated in FIG. 3 and other suitable circuit structure may be applied according to some design considerations.

Figure 4:
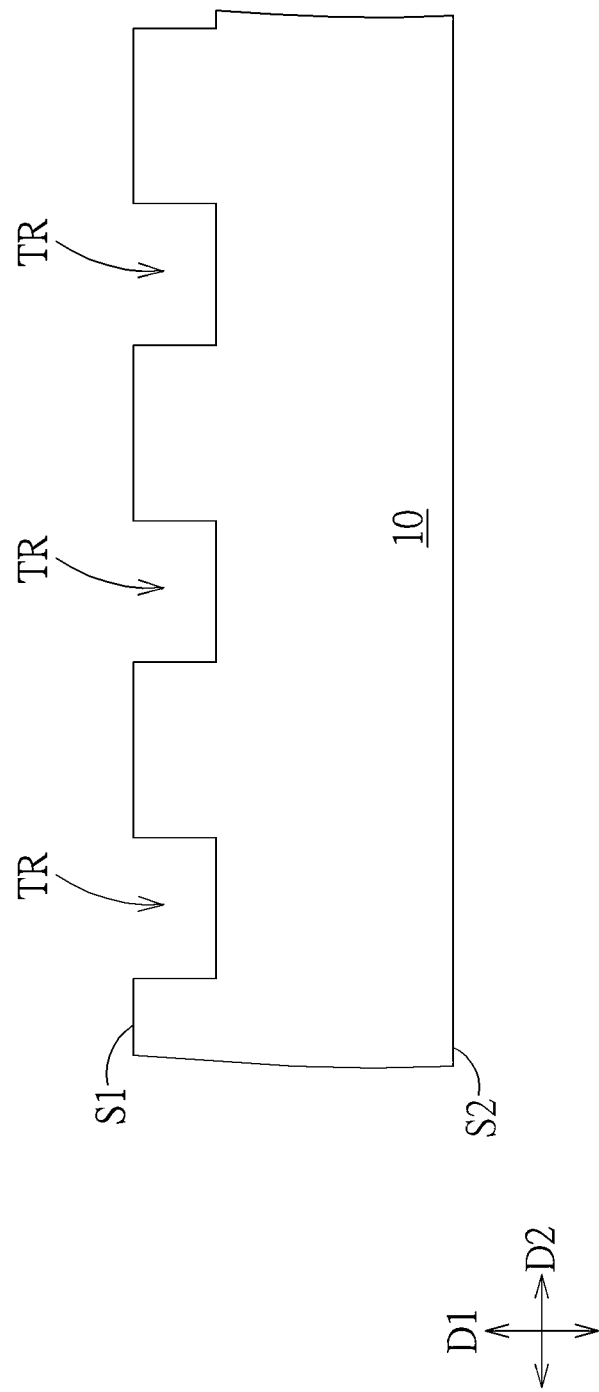
Figure 5:
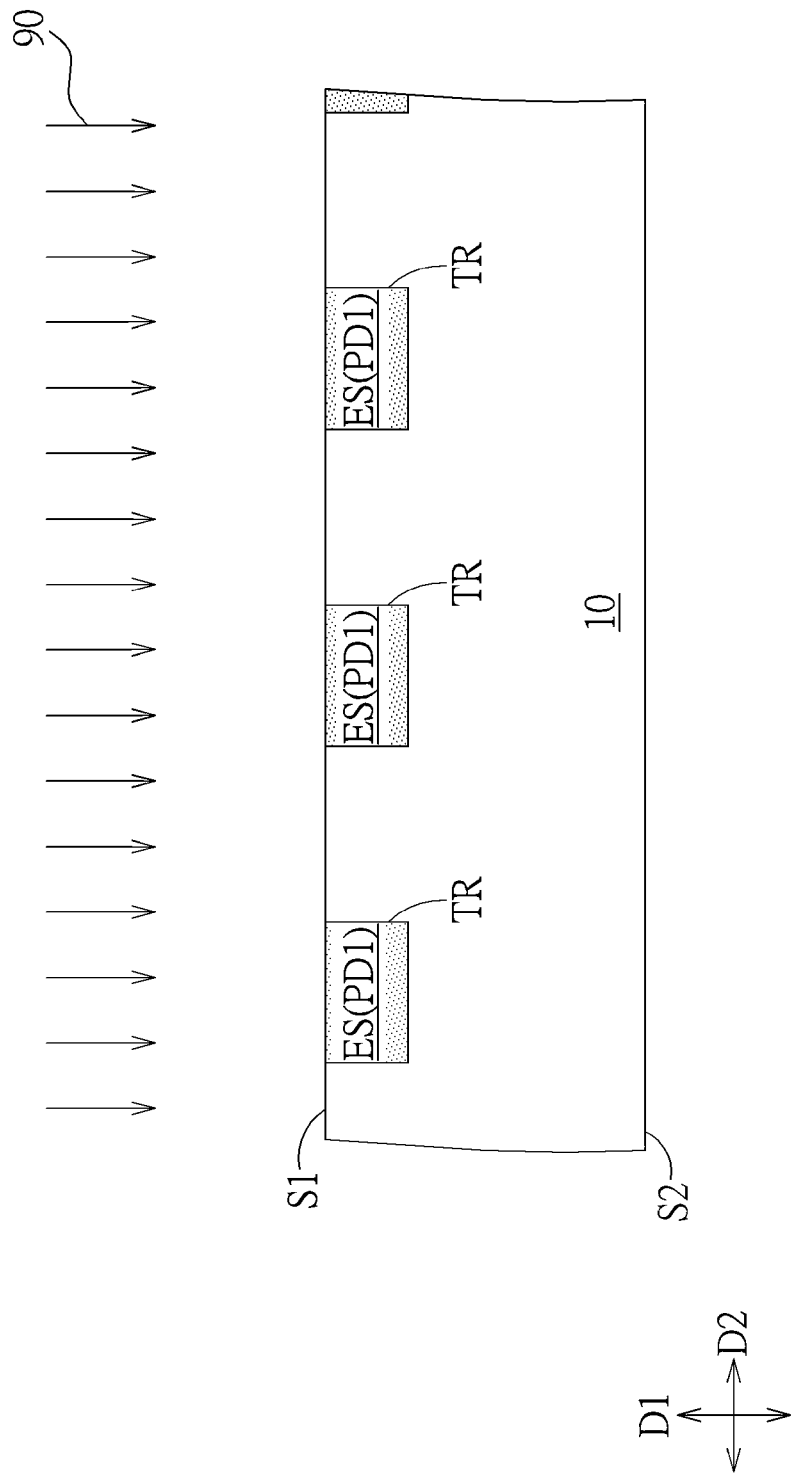
Figure 6:
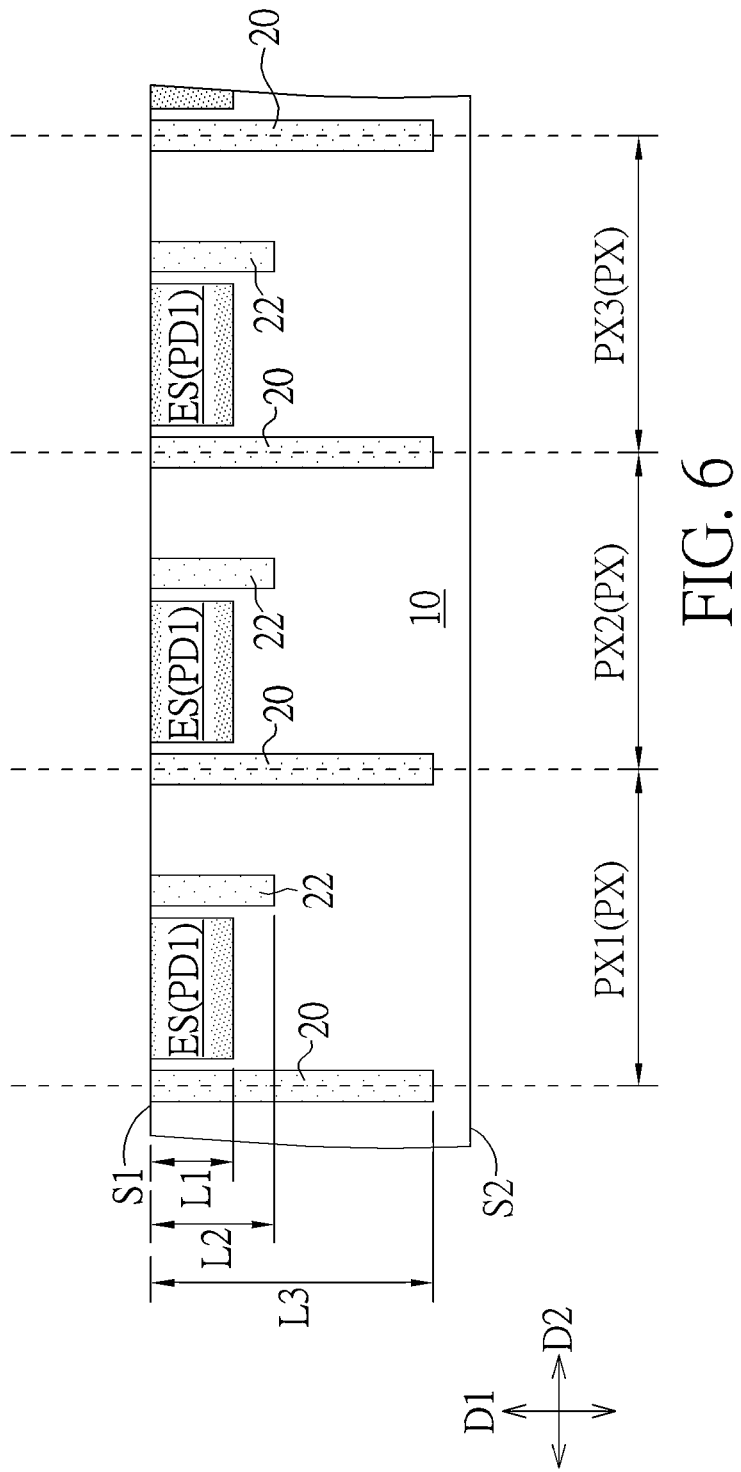
Figure 7:
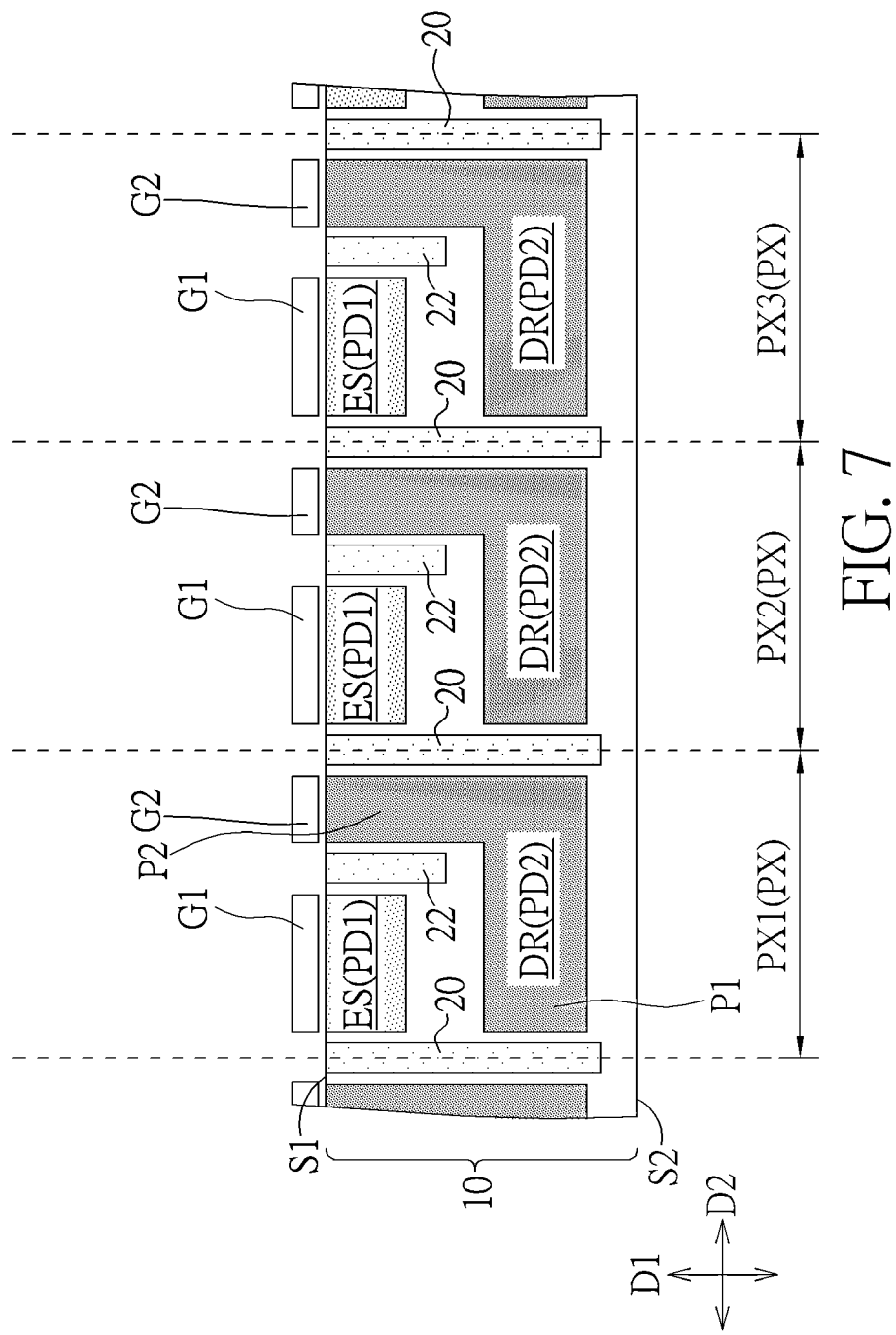
Figure 8:
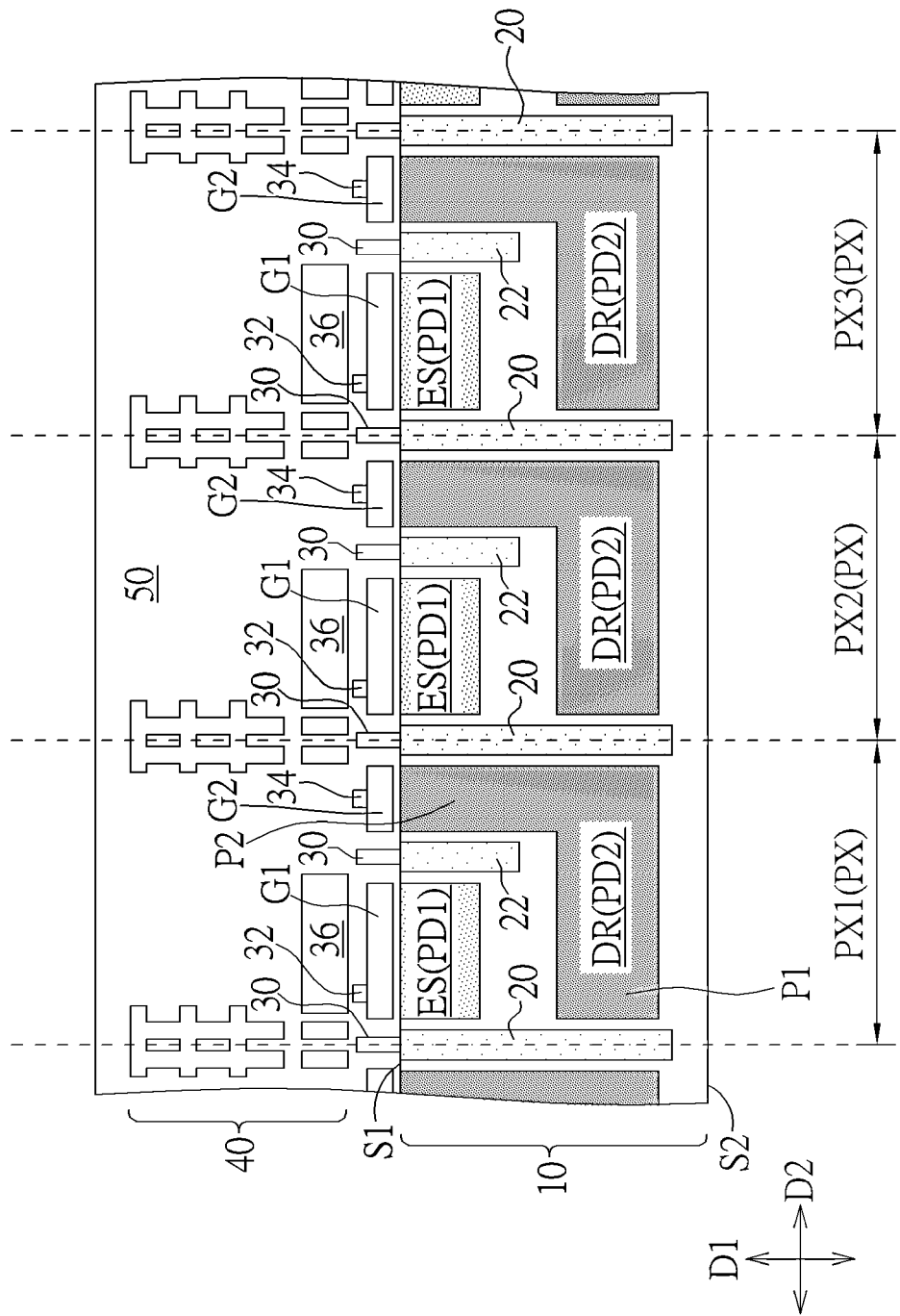
Figure 9:
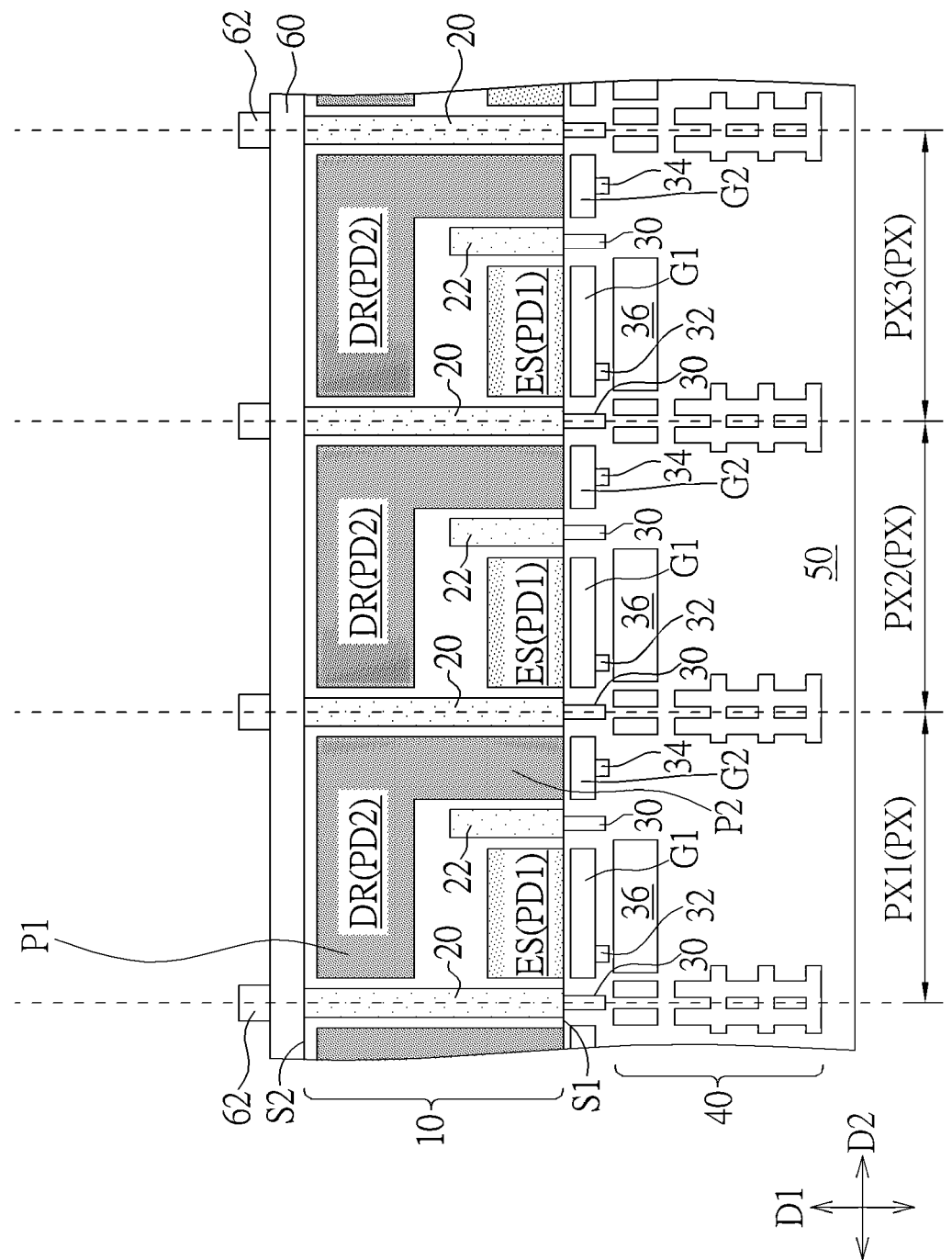

Please refer to FIGS. 4-9 and FIG. 1. FIGS. 4-9 are schematic drawings illustrating a manufacturing method of an image sensor according to an embodiment of the present invention, wherein FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 1 may be regarded as a schematic drawing in a step subsequent to FIG. 9, but not limited thereto. As shown in FIG. 1, the manufacturing method of the image sensor 101 in this embodiment may include the following steps. At least one infrared light detection structure PD1 is formed in the semiconductor substrate 10. The first isolation structure 20 is formed in the semiconductor substrate 10 for defining the pixel regions PX in the semiconductor substrate 10. At least one visible light detection structure PD2 is formed in the semiconductor substrate 10. The semiconductor substrate 10 has the first surface S1 and the second surface S2 opposite to the first surface S1 in a vertical direction (such as the first direction D1). The visible light detection structure PD2 and the infrared light detection structure PD1 are located within one of the pixel regions PX, and the first portion P1 of the visible light detection structure PD2 is disposed between the infrared light detection structure PD1 and the second surface S2 of the semiconductor substrate 10 in the first direction D1.

Specifically, the manufacturing method of the image sensor 101 in this embodiment may include but is not limited to the following steps. As shown in FIG. 4, a plurality of trenches TR may be formed from a side of the first surface S1 of the semiconductor substrate 10. Subsequently, as shown in FIG. 5, an epitaxial process 90 may be performed for forming the epitaxial structures ES on the semiconductor substrate 10, and each of the trenches TR may be filled with the epitaxial structure ES. The epitaxial process 90 may include an epitaxial growth process or other manufacturing approaches for forming the epitaxial structures ES. In addition, the epitaxial structure ES may include a plurality of epitaxial layers (such as the epitaxial layers shown in FIG. 2 described above) disposed stacked with one another, but not limited thereto. The photoelectric conversion performance of the infrared light detection structure PD1 may be enhanced by forming the infrared light detection structure PD1 with the material having a relatively high infrared light absorption rate because the infrared light detection structure PD1 may be formed in the trench TR by the epitaxial process 90, and the material composition of the infrared light detection structure PD1 may be different from the material composition of the semiconductor substrate 10 accordingly.

Subsequently, as shown in FIG. 6, the first isolation structure 20 and the second isolation structure 22 may be formed in the semiconductor substrate 10 for defining the pixel regions PX in the semiconductor substrate 10. In some embodiments, the first isolation structure 20 and the second isolation structure 22 may be respectively elongated towards the second surface S2 from the first surface S1 of the semiconductor substrate 10. A length L3 of the first isolation structure 20 in the first direction D1 may be greater than a length L2 of the second isolation structure 22 in the first direction D1, and the length L2 of the second isolation structure 22 in the first direction D1 may be greater than or equal to a length L1 of the infrared light detection structure PD1 in the first direction D1, but not limited thereto.

Subsequently, as shown in FIG. 7, the visible light detection structure PD2 may be formed in the semiconductor substrate 10, and the first gate electrode G1, the second gate electrode G2, and other related components (such as the transistors described above) may be formed on the first surface S1 of the semiconductor substrate 10. In some embodiments, the visible light detection structure PD2 may include the doped region DR in the semiconductor substrate 10, the doped region DR may be formed by performing a doping process to the semiconductor substrate 10, and the doped region DR may include a part of the semiconductor substrate 10 (such as silicon) and a dopant implanted into the semiconductor substrate 10 by the doping process described above accordingly. In some embodiments, the doped region DR may include one or a plurality of doped regions with different conductivity types (such as an n-type doped region and/or a p-type doped region), the dopant used in the doping process may include phosphorus (P), arsenic (As) or other suitable dopants, and the implantation dose used in the doping process may range from $1E+11$ ion/cm$^2$ to $1E+13$ ion/cm$^2$, but not limited thereto. Additionally, in some embodiments, because the infrared light detection structure PD1 and the second isolation structure 22 may be formed before the step of forming the visible light detection structure PD2, the doping process for forming the visible light detection structure PD2 may be performed to the first surface S1 of the semiconductor substrate 10 and/or the second surface S2 of the semiconductor substrate 10 for forming the visible light detection structure PD2 occupying the required range and reducing the negative influence of the doping process on the infrared light detection structure PD1.

Subsequently, as shown in FIG. 8 and FIG. 9, the reflective structure 30, the contact structure 32, the contact structure 34, the reflective layer 36, the interconnection structure 40, and the dielectric layer 50 may be formed on the first surface S1 of the semiconductor substrate 10, and the anti-reflection layer 60 and the patterned isolation structure 62 may be formed on the second surface S2 of the semiconductor substrate 10. In some embodiments, a thinning process may be performed to the second surface S2 of the semiconductor substrate 10 before the step of forming the anti-reflection layer 60 for removing a part of the semiconductor substrate 10 and making the semiconductor substrate 10 thinner, and the first isolation structure 20 may penetrate through the semiconductor substrate 10 in the first direction D1 after the thinning process, but not limited thereto. Subsequently, as shown in FIG. 9 and FIG. 1, the color filter units 70 and the microlenses 80 may be formed for forming the image sensor 101 described above. In some embodiments, the second surface S2 may be regarded as a light-incident surface or a side facing a light source. The infrared light detection structure PD1 and the visible light detection structure PD2 may be disposed between the second surface S2 and the circuit structure (such as the transistors corresponding to the first gate electrode G1 and the second gate electrode G2 and the interconnection structure 40) in the first direction D1, and the image sensor 101 may be regarded as a backside illumination image sensor accordingly, but not limited thereto. In addition, the manufacturing method of the image sensor 101 in this embodiment is not limited to the condition illustrated in FIGS. 4-9 described above and the image sensor 101 may be formed by other suitable manufacturing approaches according to some design considerations.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 10:
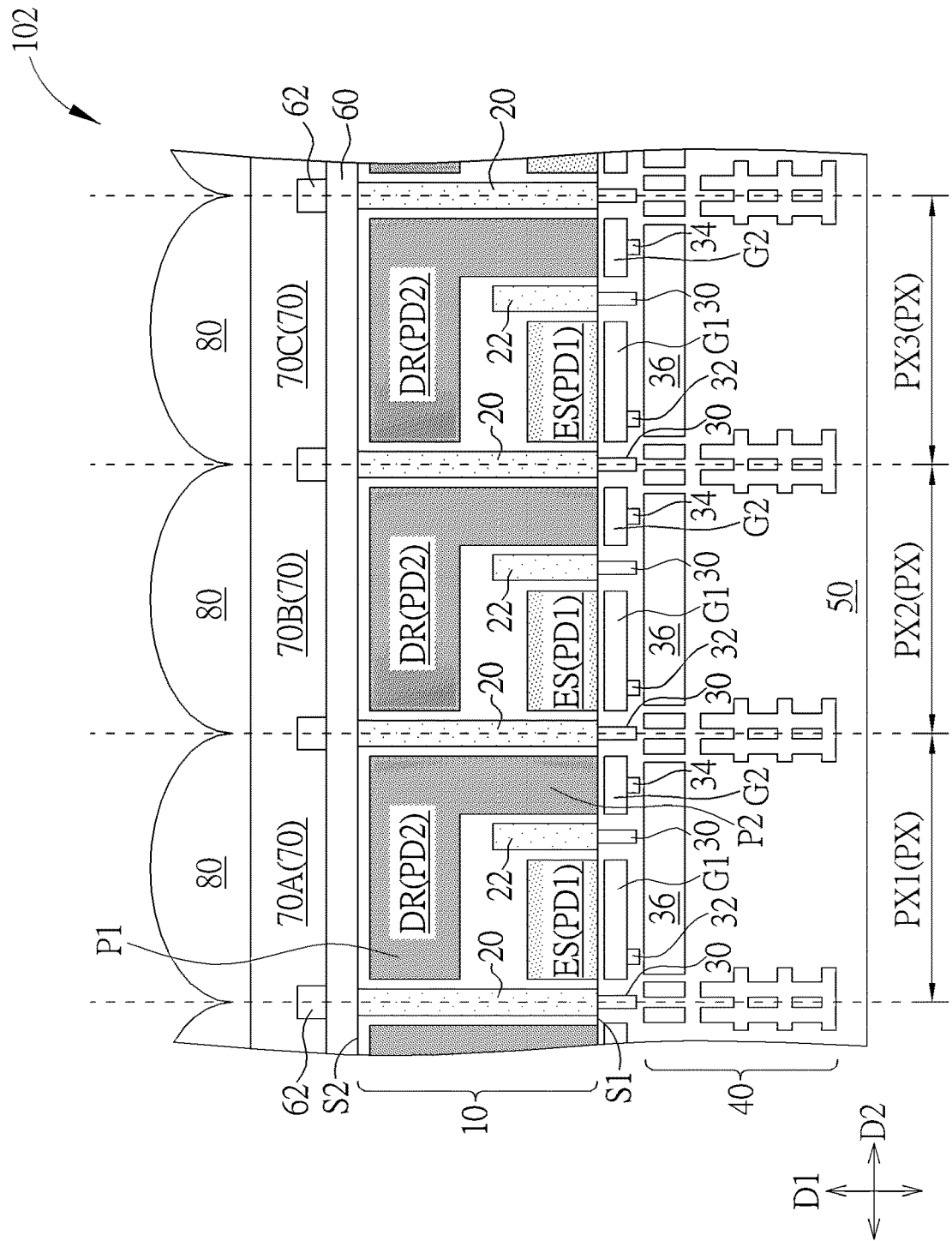
FIG. 10 is a schematic drawing illustrating an image sensor according to a second embodiment of the present invention.

Please refer to FIG. 10. FIG. 10 is a schematic drawing illustrating an image sensor 102 according to a second embodiment of the present invention. As shown in FIG. 10, in some embodiments, the reflective layer 36 may be elongated in the horizontal direction for being disposed corresponding to the infrared light detection structure PD1 and the visible light detection structure PD2 disposed within the same pixel region PX, and the visible light detection structure PD2 may be disposed between the reflective layer 36 and the second surface S2 of the semiconductor substrate 10 in the first direction D1 accordingly. The reflective layer 36 may be used to increase the amount of light entering the infrared light detection structure PD1 and the visible light detection structure PD2, and the infrared light detection performance and/or the visible light detection performance of the image sensor 102 may be improved accordingly.

To summarize the above descriptions, according to the image sensor in the present invention, the visible light detection structure and the infrared light detection structure may be disposed within the same pixel region in the semiconductor substrate for improving the infrared light sensitivity and the quantum efficiency of the infrared light detection in the image sensor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor, comprising:
   a semiconductor substrate having a first surface and a second surface opposite to the first surface in a vertical direction;
   a first isolation structure disposed in the semiconductor substrate for defining pixel regions in the semiconductor substrate;
   at least one visible light detection structure disposed in the semiconductor substrate; and
   at least one infrared light detection structure disposed in the semiconductor substrate, wherein the at least one visible light detection structure and the at least one infrared light detection structure are disposed within one of the pixel regions, and a first portion of the at least one visible light detection structure is disposed between the at least one infrared light detection structure and the second surface of the semiconductor substrate in the vertical direction, wherein the at least one infrared light detection structure comprises an epitaxial structure disposed in the semiconductor substrate, and the at least one visible light detection structure comprises a doped region comprising a material identical to a material of the semiconductor substrate.

2. The image sensor according to claim 1, wherein each of the pixel regions is surrounded by the first isolation structure in a horizontal direction.

3. The image sensor according to claim 1, wherein a second portion of the at least one visible light detection structure is disposed between the at least one infrared light detection structure and the first isolation structure in a horizontal direction.

4. The image sensor according to claim 3, wherein the second portion of the at least one visible light detection structure is directly connected with the first portion of the at least one visible light detection structure.

5. The image sensor according to claim 3, further comprising:
   a second isolation structure disposed in the semiconductor substrate, wherein a part of the second isolation structure is disposed between the second portion of the at least one visible light detection structure and the at least one infrared light detection structure in the horizontal direction.

6. The image sensor according to claim 5, wherein the first portion of the at least one visible light detection structure is disposed between the second surface of the semiconductor substrate and the second isolation structure in the vertical direction.

7. The image sensor according to claim 5, wherein a length of the second isolation structure in the vertical direction is greater than or equal to a length of the at least one infrared light detection structure in the vertical direction.

8. The image sensor according to claim 5, wherein a length of the second isolation structure in the vertical direction is less than a length of the first isolation structure in the vertical direction.

9. The image sensor according to claim 1, further comprising:
   a reflective layer disposed on the first surface of the semiconductor substrate, wherein the at least one infrared light detection structure is disposed between the reflective layer and the first portion of the at least one visible light detection structure in the vertical direction.

10. The image sensor according to claim 9, wherein the at least one visible light detection structure is disposed between the reflective layer and the second surface of the semiconductor substrate in the vertical direction.

11. The image sensor according to claim 9, wherein the reflective layer is an electrically floating conductive layer.

12. The image sensor according to claim 1, further comprising:
    a first gate electrode disposed on the first surface of the semiconductor substrate and disposed corresponding to the at least one infrared light detection structure; and
    a second gate electrode disposed on the first surface of the semiconductor substrate and disposed corresponding to the at least one visible light detection structure.

13. The image sensor according to claim 12, further comprising:
    a reflective structure disposed on the first surface of the semiconductor substrate, wherein a part of the reflective structure is disposed on the first isolation structure in the vertical direction, and another part of the reflective structure is disposed between the first gate electrode and the second gate electrode.

14. The image sensor according to claim 13, further comprising:
    a second isolation structure disposed in the semiconductor substrate, wherein a part of the second isolation structure is disposed between a second portion of the at least one visible light detection structure and the at least one infrared light detection structure in a horizontal direction, and at least a part of the reflective structure disposed between the first gate electrode and the second gate electrode overlaps the second isolation structure in the vertical direction.

15. The image sensor according to claim 13, wherein the reflective structure is an electrically floating conductive structure.

16. The image sensor according to claim 1, further comprising:
    color filter units disposed on the second surface of the semiconductor substrate, wherein each of the color filter units is disposed corresponding to one of the pixel regions in the vertical direction.

17. The image sensor according to claim 1, wherein a part of the first isolation structure penetrates through the semiconductor substrate in the vertical direction.

18. The image sensor according to claim 1, wherein the vertical direction is a thickness direction of the semiconductor substrate.

19. The image sensor according to claim 1, wherein the epitaxial structure is at least a part of a photodiode.

* * * * *